United States Patent
Kwon et al.

(10) Patent No.: US 9,487,694 B2
(45) Date of Patent: Nov. 8, 2016

(54) PHOTOSENSITIVE RESIN COMPOSITION AND COLOR FILTER USING THE SAME

(75) Inventors: Ji-Yun Kwon, Uiwang-si (KR); Youn-Je Ryu, Uiwang-si (KR); Gyu-Seok Han, Uiwang-si (KR); Hwan-Sung Cheon, Uiwang-si (KR); Hyun-Yong Cho, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 114 days.

(21) Appl. No.: 14/357,424

(22) PCT Filed: May 30, 2012

(86) PCT No.: PCT/KR2012/004234
§ 371 (c)(1),
(2), (4) Date: Jul. 14, 2014

(87) PCT Pub. No.: WO2013/094828
PCT Pub. Date: Jun. 27, 2013

(65) Prior Publication Data
US 2014/0319421 A1 Oct. 30, 2014

(30) Foreign Application Priority Data
Dec. 23, 2011 (KR) .................. 10-2011-0141438

(51) Int. Cl.
| C09K 11/06 | (2006.01) |
| G02B 5/20 | (2006.01) |
| G03F 7/004 | (2006.01) |
| G03F 7/027 | (2006.01) |
| C09K 11/02 | (2006.01) |
| G03F 7/00 | (2006.01) |
| G03F 7/105 | (2006.01) |
| G02B 5/22 | (2006.01) |

(52) U.S. Cl.
CPC .............. C09K 11/025 (2013.01); C09K 11/06 (2013.01); G02B 5/208 (2013.01); G03F 7/0007 (2013.01); G03F 7/105 (2013.01); G02B 5/223 (2013.01); G02B 2207/113 (2013.01)

(58) Field of Classification Search
CPC ........ G03F 7/0042; G02B 5/20; C09B 45/00
See application file for complete search history.

(56) References Cited

U.S. PATENT DOCUMENTS

| 5,346,545 | A | 9/1994 | Chassot |
| 5,998,091 | A | 12/1999 | Suzuki |
| 6,033,813 | A | 3/2000 | Endo et al. |
| 6,130,101 | A | 10/2000 | Mao et al. |
| 6,203,604 | B1 * | 3/2001 | Kashiwazaki ...... C09B 67/0041 106/31.27 |
| 6,596,446 | B2 | 7/2003 | Wolf et al. |
| 7,704,284 | B2 | 4/2010 | Eliu et al. |

FOREIGN PATENT DOCUMENTS

| EP | 2067838 | * | 6/2009 |
| JP | 06-041458 | A | 2/1994 |
| JP | 07-140654 | A | 6/1995 |
| JP | 07-325392 | A | 12/1995 |
| JP | 10-254133 | A | 9/1998 |
| JP | 11-343437 | A | 12/1999 |
| JP | 2001-508494 | | 6/2001 |
| JP | 2009-163226 | | 7/2009 |
| KR | 10-2001-0095243 | A | 11/2001 |
| KR | 10-2002-0015650 | A | 2/2002 |
| KR | 10-2003-0094982 | A | 12/2003 |
| KR | 10-2005-0020653 | A | 3/2005 |
| KR | 10-2008-0048501 | A | 6/2008 |
| KR | 10-0872098 | B1 | 11/2008 |
| KR | 10-2009-0106226 | A | 10/2009 |
| KR | 10-2010-0010490 | A | 2/2010 |
| KR | 10-2010-0071766 | A | 6/2010 |
| KR | 10-2010-0078845 | A | 7/2010 |
| KR | 10-2010-0080142 | A | 7/2010 |
| KR | 10-2010-0092892 | A | 8/2010 |
| KR | 10-2010-0105409 | A | 9/2010 |
| KR | 10-2010-0138779 | A | 12/2010 |
| KR | 10-2011-0046325 | A | 5/2011 |
| KR | 10-2011-0049701 | A | 5/2011 |
| KR | 10-2011-0103861 | A | 9/2011 |
| TW | 201005434 | A | 2/2010 |
| WO | 99/15517 | A1 | 4/1999 |
| WO | 2013/094828 | A1 | 6/2013 |

OTHER PUBLICATIONS

International Search Report in counterpart International Application No. PCT/KR2012/004234 dated Jan. 2, 2013, pp. 1-7.

* cited by examiner

*Primary Examiner* — Carol M Koslow
(74) *Attorney, Agent, or Firm* — Additon, Higgins & Pendleton, P.A.

(57) ABSTRACT

Disclosed are a photosensitive resin composition including a composite dye that includes a red fluorescent dye re-emitting light at a 400 to 800 nm fluorescent wavelength; and a metal complex dye including at least one metal ion selected from Mg, Ni, Co, Zn, Cr, Pt, and Pd, and a color filter using the same.

12 Claims, 2 Drawing Sheets

PHOTOSENSITIVE RESIN COMPOSITION AND COLOR FILTER USING THE SAME

CROSS-REFERENCE TO RELATED APPLICATIONS

This application claims priority to and the benefit of International Application No. PCT/KR2012/004234, filed May 30, 2012, which published as WO 2013/094828 on Jun. 27, 2013, and Korean Patent Application No. 10-2011-0141438, filed in the Korean Intellectual Property Office on Dec. 23, 2011, the entire disclosure of each of which is incorporated herein by reference.

TECHNICAL FIELD

This disclosure relates to a photosensitive resin composition and a color filter using the same.

BACKGROUND ART

Recently, as the use of large screen liquid crystal displays (LCD) has significantly increased, it has become increasingly required to improve its performance. There is active research on increasing the process margin of a color filter for productivity, since the color filter is the most important factor in realizing colors among the many parts of a liquid crystal display. In addition, in order to increase color purity of a large screen liquid crystal display (LCD), a color filter is fabricated using a photosensitive resin composition prepared by increasing concentration of a colorant. Accordingly, a photosensitive resin composition is required to have lowered development speed to increase productivity and yield in the manufacturing process and to have excellent sensitivity despite little exposure to light.

A photosensitive resin composition is used to fabricate a color filter through a method of dying, electrophoretic deposition (EPD), printing, pigment dispersion, and the like, in which three or more colors are coated on a transparent substrate. Recently, the pigment dispersion has been more actively adopted.

A color filter manufactured through a pigment dispersion method has limitation in luminance and contrast ratio that originates from a pigment particle size. In order to overcome the limitation, researches on a photosensitive resin composition introducing a dye that does not form particles or has a smaller primary particle diameter than a pigment dispersion solution has been made.

DISCLOSURE

Technical Problem

One embodiment provides a photosensitive resin composition having high luminance and a high contrast ratio.

Another embodiment provides a color filter fabricated using the photosensitive resin composition.

Technical Solution

According to one embodiment, provided is a photosensitive resin composition including a composite dye that includes a red fluorescent dye that absorbs light of a visible region of spectrum and re-emits light in a wavelength greater than the wavelength of absorbs light; and a metal complex dye including at least one metal ion selected from Mg, Ni, Co, Zn, Cr, Pt, and Pd.

The red fluorescent dye may include a compound represented by the following Chemical Formula 1.

[Chemical Formula 1]

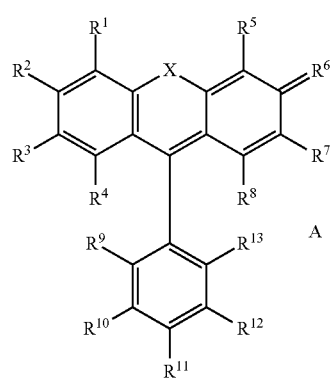

In Chemical Formula 1,
$R^2$ is —OH, —O—, or —NR$^a$R$^b$ (wherein, R$^a$ and R$^b$ are each independently hydrogen, a substituted or unsubstituted C1 to C5 alkyl group, a substituted or unsubstituted C1 to C5 alkoxy group, a substituted or unsubstituted C3 to C10 cycloalkyl group, a substituted or unsubstituted C3 to C10 heterocycloalkyl group, a substituted or unsubstituted C6 to C20 aryl group, a substituted or unsubstituted C3 to C20 heteroaryl group, or a substituted or unsubstituted C1 to C5 alkyl (meth)acrylate group, or R$^a$ and R$^b$ are respectively linked to R$^1$ and R$^3$ to form a ring), $R^6$ is =O or =NR$^c$R$^{d+}$ (wherein, R$^c$ and R$^d$ are each independently hydrogen, a substituted or unsubstituted C1 to C5 alkyl group, a substituted or unsubstituted C1 to C5 alkoxy group, a substituted or unsubstituted C3 to C10 cycloalkyl group, a substituted or unsubstituted C3 to C10 heterocycloalkyl group, a substituted or unsubstituted C6 to C20 aryl group, a substituted or unsubstituted C3 to C20 heteroaryl group, or a substituted or unsubstituted C1 to C5 alkyl (meth)acrylate group, or R$^c$ and R$^d$ are respectively linked to R$^5$ and R$^7$ to form a ring), $R^1$, $R^3$ to $R^5$ and $R^7$ to $R^{13}$ are each independently hydrogen, a halogen, a carboxyl group, —COO$^-$, —COOR$^e$ (wherein, R$^e$ is a substituted or unsubstituted C1 to C10 alkyl group), a sulfonic acid group, —SO$_3^-$, —SO$_2$Cl$^-$, a nitro group, a hydroxy group, —HgOH, a substituted or unsubstituted C1 to C20 alkyl group, a radical represented by the following Chemical Formula 2, or NRR' (wherein, R and R' are each independently hydrogen, a substituted or unsubstituted C1 to C20 alkyl group, a substituted or unsubstituted C6 to C30 aryl group, or a radical represented by the following Chemical Formula 3), X is —O—, —S—, —CO—, or —NR$^f$— (wherein, R$^f$ is hydrogen, or a substituted or unsubstituted C1 to C20 alkyl group), and A is a halide ion, ClO$_4^-$, BF$_4^-$, SbF$_6^-$, CF$_3$SO$_3^-$, CF$_3$COO$^-$, N(SO$_2$CF$_3$)$_2^-$, one of ionic compounds represented by the following Chemical Formulae 4-1 and 4-2, an alkali metal cation, an alkaline-earth metal cation, or an alkyl ammonium.

[Chemical Formula 2]

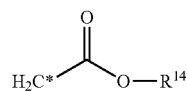

In Chemical Formula 2, $R^{14}$ is hydrogen, or a substituted or unsubstituted C1 to C20 alkyl group.

[Chemical Formula 3]

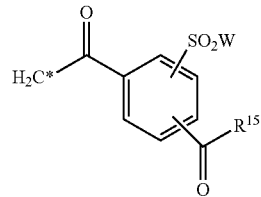

In Chemical Formula 3, $R^{15}$ is hydrogen, or a substituted or unsubstituted C1 to C20 alkyl group, and W is a halogen.

[Chemical Formula 4-1]

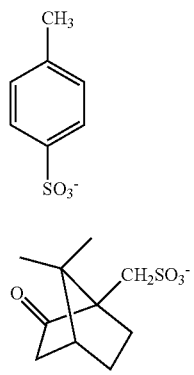

[Chemical Formula 4-2]

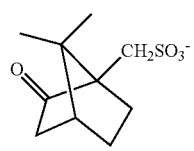

The red fluorescent dye may include at least one selected from the compounds represented by the following Chemical Formulae 5-1 to 5-12.

[Chemical Formula 5-1]

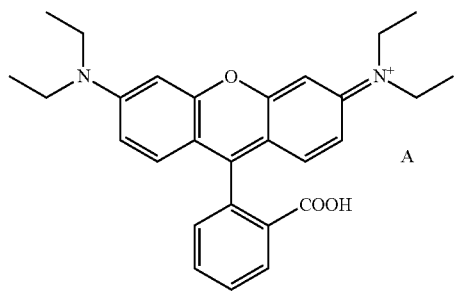

In Chemical Formula 5-1, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2.

[Chemical Formula 5-2]

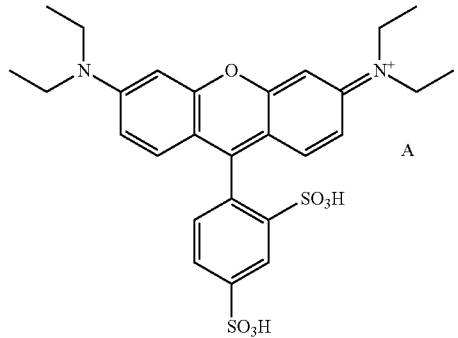

In Chemical Formula 5-2, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2.

[Chemical Formula 5-3]

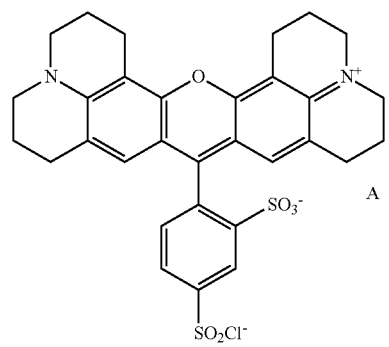

In Chemical Formula 5-3, A is an alkali metal cation or an alkyl ammonium.

[Chemical Formula 5-4]

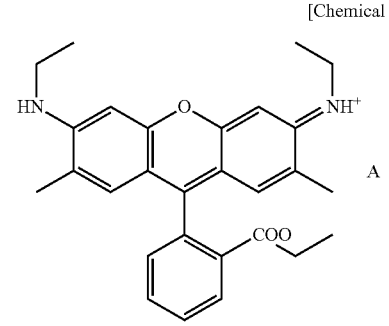

In Chemical Formula 5-4, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2.

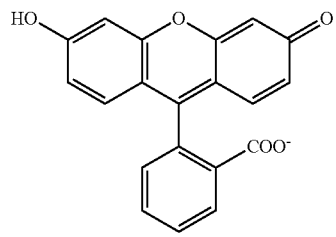

[Chemical Formula 5-5]

In Chemical Formula 5-5, A is an alkali metal cation or an alkyl ammonium.

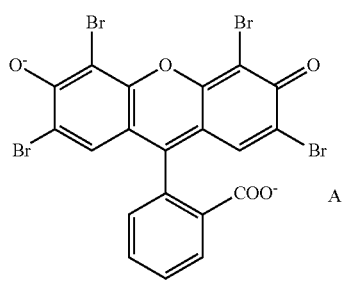

[Chemical Formula 5-6]

In Chemical Formula 5-6, A is an alkaline-earth metal cation.

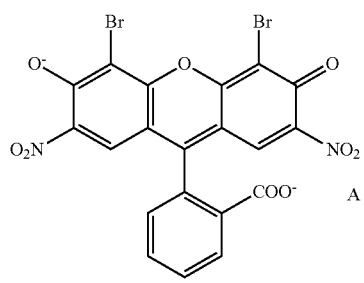

[Chemical Formula 5-7]

In Chemical Formula 5-7, A is an alkaline-earth metal cation.

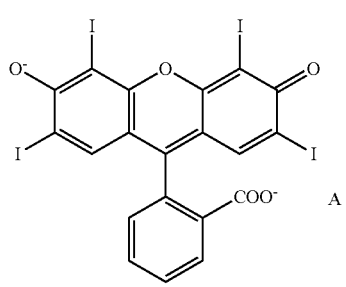

[Chemical Formula 5-8]

In Chemical Formula 5-8, A is an alkaline-earth metal cation.

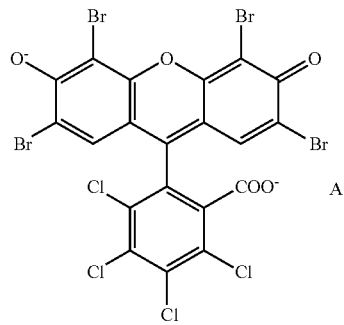

[Chemical Formula 5-9]

In Chemical Formula 5-9, A is an alkaline-earth metal cation.

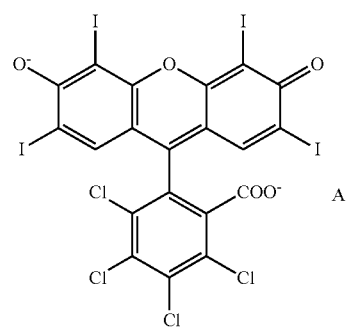

[Chemical Formula 5-10]

In Chemical Formula 5-10, A is an alkaline-earth metal cation.

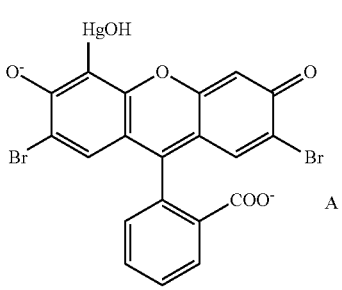

[Chemical Formula 5-11]

In Chemical Formula 5-11, A is an alkaline-earth metal cation.

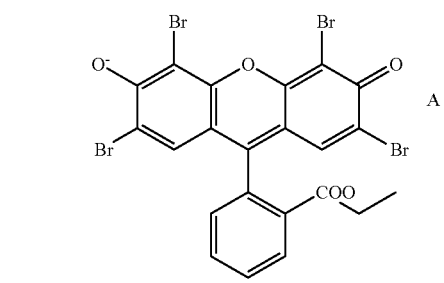

[Chemical Formula 5-12]

In Chemical Formula 5-12, A is an alkali metal cation or an alkyl ammonium.

The red fluorescent dye may include at least one selected from the compounds represented by the following Chemical Formula 6 and the following Chemical Formula 7.

[Chemical Formula 6]

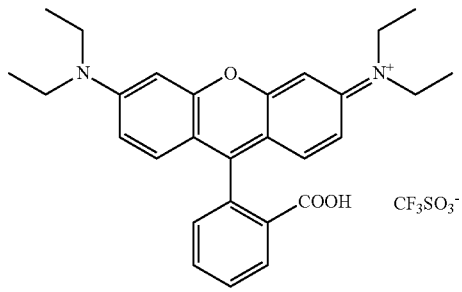

[Chemical Formula 7]

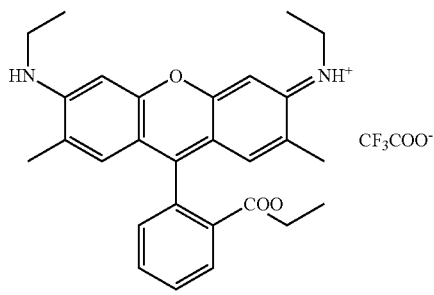

The composite dye may have a maximum absorption peak in the wavelength of 450 to 650 nm.

The metal complex dye may have a maximum absorption peak in the wavelength of 200 to 800 nm.

The metal complex dye may include a composite of a metal ion; and at least one selected from solvent yellow 19, solvent yellow 21, solvent yellow 82, solvent orange 45, solvent orange 62, solvent red 8, solvent red 32, and solvent red 109.

The composite dye may include the red fluorescent dye and the metal complex dye at a weight ratio of 1:0.5 to 1:2.

The composite dye may have a maximum absorption peak in the wavelength of 450 to 650 nm.

The photosensitive resin composition may further include a pigment.

The photosensitive resin composition may include the composite dye and the pigment at a weight ratio of 1:9 to 9:1.

The photosensitive resin composition may further include an acryl-based binder resin, a photopolymerization initiator, a photopolymerizable monomer, and a solvent, and the photosensitive resin composition may include 1 to 80 wt % of the composite dye; 0.1 to 30 wt % of the acryl-based binder resin; 0.1 to 5 wt % of the photopolymerization initiator; 0.1 to 30 wt % of the photopolymerizable monomer; and a balance amount of the solvent.

According to another embodiment, provided is a color filter manufactured using the photosensitive resin composition.

Further embodiments of this disclosure are described in the following detailed description.

Advantageous Effects

The photosensitive resin composition simultaneously realizes high luminance and a contrast ratio, and may be usefully applied to a color filter having excellent pattern characteristics, development processibility, chemical resistance, color reproducibility.

BEST MODE

Figure 1:
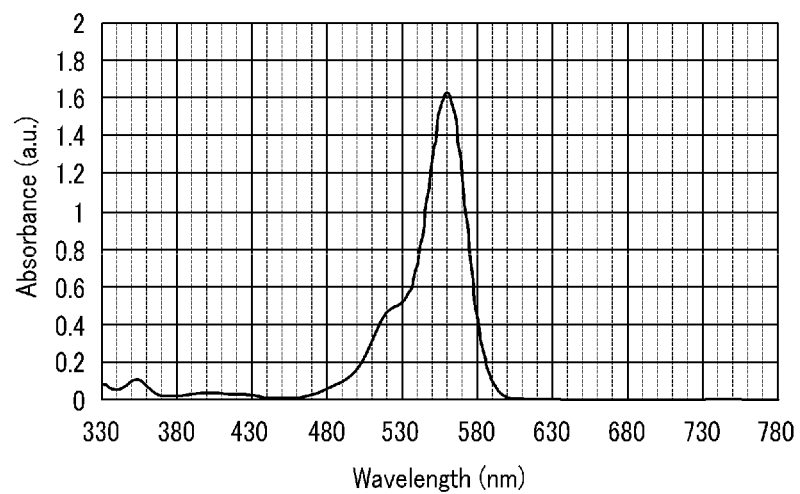
FIG. 1 is a graph showing a spectrum of the red fluorescent dye used in Example 1.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when specific definition is not otherwise provided, the term, "substituted" refers to one substituted with at least one substituent selected from the group consisting of a halogen (F, Cl, Br, I), a hydroxyl group, a C1 to C20 alkoxy group, a nitro group, a cyano group, an amine group, an azido group, an amidino group, a hydrazino group, a hydrazono group, a carbonyl group, a carbamyl group, a thiol group, an ester group, a carboxyl group or salts thereof, a sulfonic acid group or salts thereof, a phosphoric acid group or salts thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof instead of at least one hydrogen.

As used herein, when specific definition is not otherwise provided, the terms "heterocycloalkyl group", "heterocycloalkenyl group", "heterocycloalkynyl group", and "heterocycloalkylene group" refer to a cyclic group of a cycloalkyl, cycloalkenyl, cycloalkynyl, and cycloalkylene including at least one heteroatom of N, O, S, or P.

As used herein, when specific definition is not otherwise provided, "(meth)acrylate" refers to both "acrylate" and "methacrylate".

According to one embodiment, a photosensitive resin composition includes a composite dye including at least two dye, for example (A) a composite dye, (A') a pigment, (B) an acryl-based binder resin, (C) a photopolymerization initiator, (D) a photopolymerizable monomer, and (E) a solvent.

Hereinafter, each component is described in detail.

(A) Composite Dye

The composite dye may include a mixture of a red fluorescent dye and a metal complex dye, and each dye is described hereinafter.

(A-1) Red Fluorescent Dye

The red fluorescent dye may include a compound having a counter ion together while having a base backbone of xanthene ring, particularly, a compound represented by the following Chemical Formula 1.

[Chemical Formula 1]

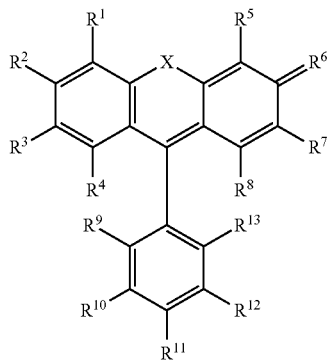

In Chemical Formula 1, $R^2$ is —OH, —O—, or —NR$^a$R$^b$ (wherein, $R^a$ and $R^b$ are each independently hydrogen, a substituted or unsubstituted C1 to C5 alkyl group, a substituted or unsubstituted C1 to C5 alkoxy group, a substituted or unsubstituted C3 to C10 cycloalkyl group, a substituted or unsubstituted C3 to C10 heterocycloalkyl group, a substituted or unsubstituted C6 to C20 aryl group, a substituted or unsubstituted C3 to C20 heteroaryl group, or a substituted or unsubstituted C1 to C5 alkyl (meth)acrylate group, or $R^a$ and $R^b$ are respectively linked to $R^1$ and $R^3$ to form a ring). In one embodiment, $R^2$ may be preferably —NR$^a$R$^b$, wherein $R^a$ and $R^b$ are each substituted or unsubstituted C1 to C5 alkyl group. As described above, according to substitution of an amine group substituted with lower alkyl group to a xanthene ring, it may have the wavelength band of red fluorescent and provide the high luminance by using the red fluorescent dye.

In Chemical Formula 1, $R^6$ is =O or =NR$^c$R$^{d+}$ (wherein, $R^c$ and $R^d$ are each independently hydrogen, a substituted or unsubstituted C1 to C5 alkyl group, a substituted or unsubstituted C1 to C5 alkoxy group, a substituted or unsubstituted C3 to C10 cycloalkyl group, a substituted or unsubstituted C3 to C10 heterocycloalkyl group, a substituted or unsubstituted C6 to C20 aryl group, a substituted or unsubstituted C3 to C20 heteroaryl group, or a substituted or unsubstituted C1 to C5 alkyl (meth)acrylate group, or $R^c$ and $R^d$ are respectively linked to $R^5$ and $R^7$ to form a ring). In one embodiment, $R^6$ may be preferably =NR$^c$R$^{d+}$, wherein $R^c$ and $R^d$ are each substituted or unsubstituted C1 to C5 alkyl group. According to substitution of an amine group substituted with lower alkyl group to a xanthene ring, it may have the wavelength band of red fluorescent and provide a high luminance by using the red fluorescent dye.

In Chemical Formula 1, $R^1$, $R^3$ to $R^5$ and $R^7$ to $R^{13}$ are each independently hydrogen, a halogen, a carboxyl group, —COO$^-$, —COOR$^e$ (wherein, $R^e$ is a substituted or unsubstituted C1 to C10 alkyl group), a sulfonic acid group, —SO$_3^-$, —SO$_2$O$^-$, a nitro group, a hydroxy group, —HgOH, a substituted or unsubstituted C1 to C20 alkyl group, a radical represented by the following Chemical Formula 2, or NRR' (wherein, R and R' are each independently hydrogen, a substituted or unsubstituted C1 to C20 alkyl group, a substituted or unsubstituted C6 to C30 aryl group, or a radical represented by the following Chemical Formula 3).

[Chemical Formula 2]

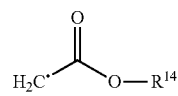

In Chemical Formula 2, $R^{14}$ may be hydrogen, or a substituted or unsubstituted C1 to C20 alkyl group.

[Chemical Formula 3]

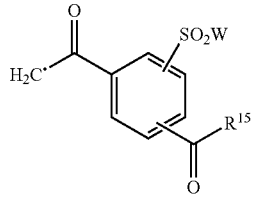

In Chemical Formula 3, $R^{15}$ may be hydrogen, or a substituted or unsubstituted C1 to C20 alkyl group, and W may be a halogen.

In Chemical Formula 1, X is —O—, —S—, —CO—, or —NR$^f$— (wherein, $R^f$ is hydrogen, or a substituted or unsubstituted C1 to C20 alkyl group).

In Chemical Formula 1, A is a counter ion, for example a halide ion, ClO$_4^-$, BF$_4^-$, SbF$_6^-$, CF$_3$SO$_3^-$, CF$_3$COO$^-$, N(SO$_2$CF$_3$)$_2^-$, one of ionic compounds represented by the following Chemical Formulae 4-1 and 4-2, an alkali metal cation, an alkaline-earth metal cation, or an alkyl ammonium. The alkali metal cation may be Na$^+$, K$^+$, and the like, and the alkaline-earth metal cation may be Ca$^+$, Mg$^+$, and the like. The alkyl ammonium may be tetramethyl ammonium, tetrabutyl ammonium, and the like. By forming a compound including the counter ion with xanthene ring, it may have a wavelength band of red fluorescent and provide a high luminance by using red fluorescent dye.

[Chemical Formula 4-1]

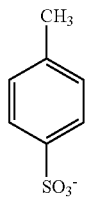

[Chemical Formula 4-2]

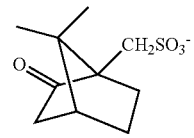

The red fluorescent dye may include at least one selected from the compounds represented by the following Chemical Formulae 5-1 to 5-12.

[Chemical Formula 5-1]

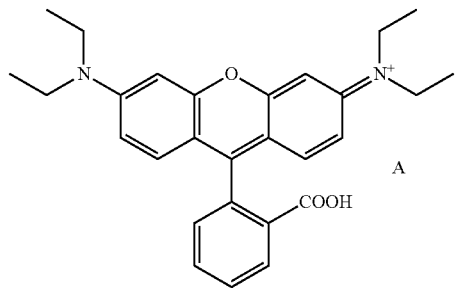

In Chemical Formula 5-1, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2.

[Chemical Formula 5-2]

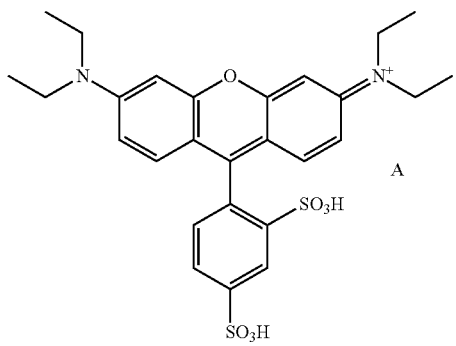

In Chemical Formula 5-2, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2.

[Chemical Formula 5-3]

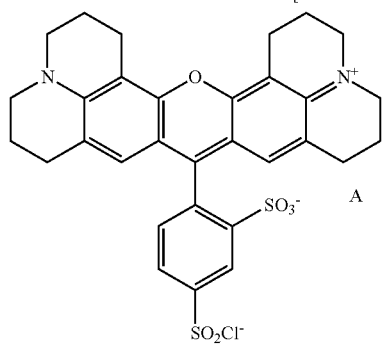

In Chemical Formula 5-3, A is an alkali metal cation or an alkyl ammonium.

[Chemical Formula 5-4]

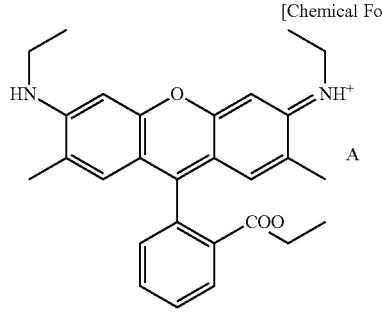

In Chemical Formula 5-4, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2.

[Chemical Formula 5-5]

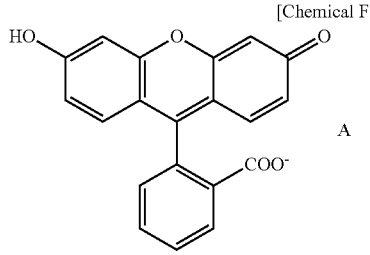

In Chemical Formula 5-5, A is an alkali metal cation or an alkyl ammonium.

[Chemical Formula 5-6]

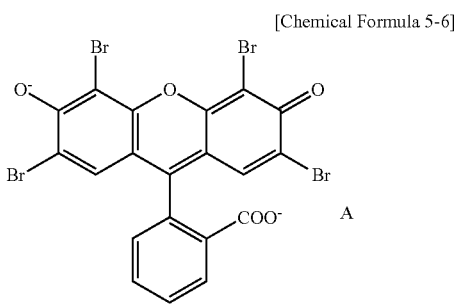

In Chemical Formula 5-6, A is an alkaline-earth metal cation.

[Chemical Formula 5-7]

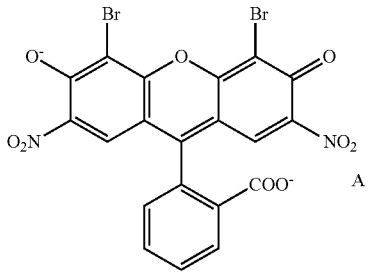

In Chemical Formula 5-7, A is an alkaline-earth metal cation.

[Chemical Formula 5-8]

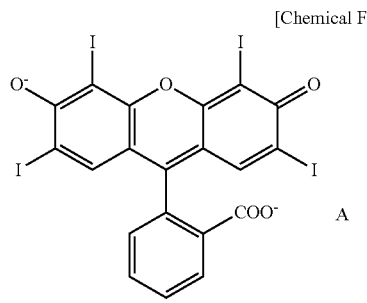

In Chemical Formula 5-8, A is an alkaline-earth metal cation.

[Chemical Formula 5-9]

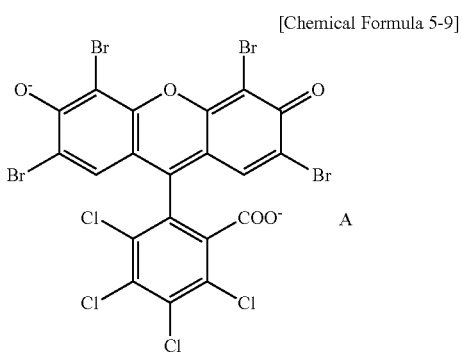

In Chemical Formula 5-9, A is an alkaline-earth metal cation.

[Chemical Formula 5-10]

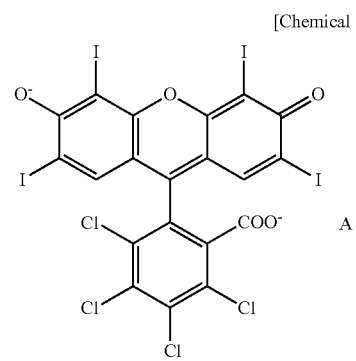

In Chemical Formula 5-10, A is an alkaline-earth metal cation.

[Chemical Formula 5-11]

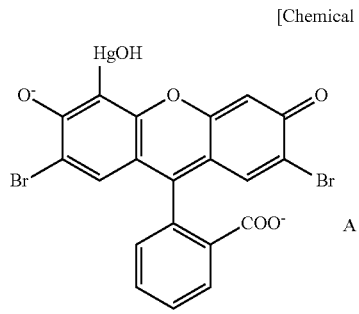

In Chemical Formula 5-11, A is an alkaline-earth metal cation.

[Chemical Formula 5-12]

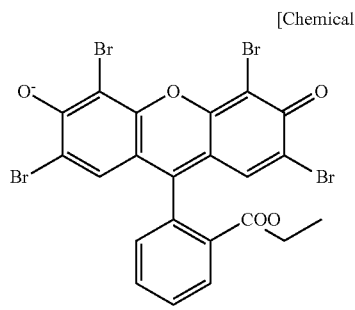

In Chemical Formula 5-12, A is an alkali metal cation or an alkyl ammonium.

The red fluorescent dye may include at least one selected from the compounds represented by the following Chemical Formula 6 and the following Chemical Formula 7.

[Chemical Formula 6]

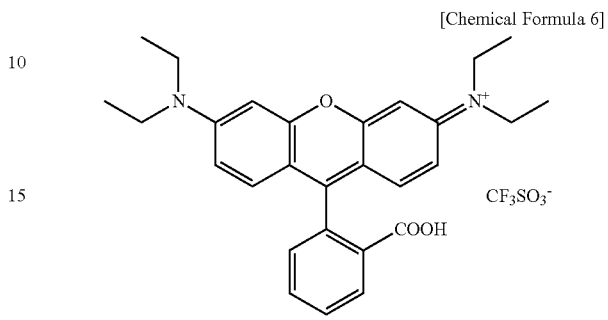

[Chemical Formula 7]

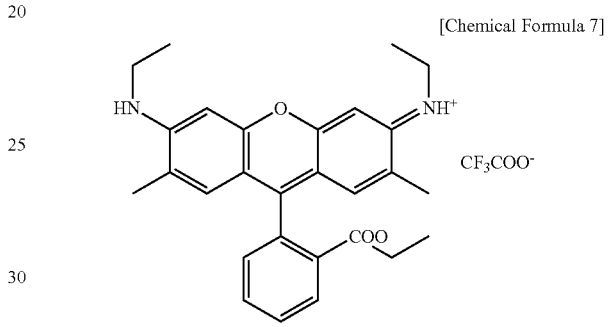

The red fluorescent dye is a molecule that is dyed itself and absorbs light of a visible region of spectrum, just like a typical dye. However, the red fluorescent dye re-emits fluorescent light of visible spectrum in a wavelength greater than the wavelength of absorbed light. The wavelength of the re-emitted light may range from 400 to 800 nm and the red fluorescent dye may have a maximum absorption peak in a UV wavelength of 450 to 650 nm.

(A-2) Metal Complex Dye

The metal complex dye may have a maximum absorption peak in the wavelength of 200 to 800 nm.

The metal complex dye may be at least one selected from a direct dye, an acidic dye, a basic dye, an acidic mordant dye, a sulfide dye, a reduction dye, an azoic dye, a disperse dye, a reactive dye, an oxidation dye, an alcohol soluble dye, an azo dye, an anthraquinone dye, an indigoid dye, a carbonium ion dye, a phthalocyanine dye, a nitro dye, a quinoline dye, a cyanine dye, a polymethine dye, or a combination thereof.

The metal complex dye may include at least one metal ion selected from Mg, Ni, Co, Zn, Cr, Pt, and Pd.

The metal complex dye may include a composite of a metal ion and at least one selected from solvent yellow 19, solvent yellow 21, solvent yellow 82, solvent orange 45, solvent orange 62, solvent red 8, solvent red 32, and solvent red 109.

Although the above-described red fluorescent dye has a high luminescence characteristic, it has a characteristic of scattering polarization light. Therefore, it has a low contrast ratio. According to one embodiment, the low contrast ratio caused by the use of the red fluorescent dye may be improved by mixing the red fluorescent dye and the metal complex dye. Therefore, when a composite dye of the red fluorescent dye and the metal complex dye is used, not only the high luminance but also the high contrast ratio may be simultaneously obtained.

The red fluorescent dye and the metal complex dye may be used at a weight ratio of 1:0.5 to 1:2, and specifically 1:1 to 1:1.5. Within the weight ratio range, the luminance and contrast ratio may be improved.

The composite dye including the red fluorescent dye and the metal complex dye may have a solubility of 5 or more, specifically 5 to 10 with respect to a solvent used in a photosensitive resin composition in accordance with one embodiment, that is, the solvent (E), which is to be described later. The solubility may be obtained by the amount (g) of the composite dye that is dissolved in 100 g of the solvent. When the solubility of the composite dye is within the range, compatibility with the acryl-based binder resin, photopolymerization initiator, and photopolymerizable monomer, and coloring properties may be secured and the composite dye may be prevented from being precipitated.

The composite dye may simultaneously obtain high luminance and high contrast ratio by mixing and using the red fluorescent dye and the metal complex dye. According to one embodiment, a color filter having a transmittance of 95% or more at a wavelength of greater then 650 to 800 nm may be realized.

The composite dye may have a maximum absorption peak in the wavelength of 450 to 650 nm, and specifically 500 to 600 nm.

The composite dye may be present in an amount of 1 to 80 wt %, and specifically 50 to 70 wt % based on the total amount of the photosensitive resin composition. When the composite dye is used within the range, high luminance and a contrast ratio may be shown in desired color coordinates.

The composite dye may realize high provide high luminance and a contrast ratio compared to a photosensitive resin composition including a pigment.

(A') Pigment

The composite dye may be further mixed with a pigment and used, and in this case, the luminance and contrast ratio may be improved even more.

The pigment may be at least one selected from a red pigment and a yellow pigment.

The red pigment may include C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, and the like of a color index, and they may be used singularly or as a mixture of more than two of them may be used.

The yellow pigment may be C.I. pigment yellow 150, and the like.

The pigment may be prepared as a dispersion solution and included in a photosensitive resin composition. Such a pigment dispersion may include the pigment and solvent, a dispersing agent, a binder resin, and the like.

The solvent may include ethylene glycol acetate, ethyl cellosolve, propylene glycol methyl ether acetate, ethyl lactate, polyethylene glycol, cyclohexanone, propylene glycol methyl ether, and the like, and in one embodiment, propylene glycol methyl ether acetate among them may be preferable.

The dispersing agent helps the pigment be uniformly dispersed, and may include a non-ionic, anionic, or cationic dispersing agent. Examples of the dispersing agent include polyalkylene glycol and esters thereof, polyoxy alkylene, polyhydric alcohol ester alkylene oxide additional products, alcohol alkylene oxide additional products, sulfonic acid esters, sulfonic acid salts, carboxylic acid esters, carboxylic acid salts, alkyl amide alkylene oxide additional products, alkyl amines, and the like. These dispersing agents can be used singularly or in a combination of two or more.

In addition, a carboxyl-containing acryl-based resin as well as the dispersing agent can be added to the pigment in order to improve the pattern of pixels as well as stability of a pigment dispersion solution.

The pigment has a primary particle diameter ranging from 10 to 70 nm. When it has a primary particle diameter within the above range, it has excellent stability in a dispersion solution and may improve resolution of pixels.

In addition, the pigment has no particular limit in secondary particle diameter but may have a secondary particle diameter of less than or equal to 200 nm, and specifically 70 to 100 nm, considering resolution of pixels.

The composite dye and the pigment are mixed in a weight ratio ranging from 1:9 to 9:1, and specifically from 3:7 to 7:3. When mixed within the range, the composition can not only maintain color characteristics but also have high luminance and contrast ratio.

(B) Acryl-Based Binder Resin

The acryl-based binder resin is a copolymer of a first ethylenic unsaturated monomer and a second ethylenic unsaturated monomer that is copolymerizable with the first ethylenic unsaturated monomer, and a resin including at least one acryl-based repeating unit.

The first ethylenic unsaturated monomer is an ethylenic unsaturated monomer including at least one carboxyl group. Examples of the monomer include acrylic acid, methacrylic acid, maleic acid, itaconic acid, fumaric acid, or a combination thereof.

The first ethylenic unsaturated monomer may be included in an amount ranging from 5 to 50 wt %, and specifically, from 10 to 40 wt % based on the total amount of the acryl-based binder resin.

Examples of the second ethylenic unsaturated monomer may include an aromatic vinyl compound such as styrene, α-methylstyrene, vinyltoluene, vinylbenzylmethylether, and the like; an unsaturated carboxylic acid ester compound such as methyl(meth)acrylate, ethyl(meth)acrylate, butyl(meth)acrylate, 2-hydroxyethyl(meth)acrylate, 2-hydroxy butyl (meth)acrylate, benzyl(meth)acrylate, cyclohexyl(meth)acrylate, phenyl(meth)acrylate, and the like; an unsaturated carboxylic acid amino alkyl ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated carboxylic acid glycidyl ester compound such as glycidyl(meth)acrylate and the like; a vinyl cyanide compound such as (meth)acrylonitrile and the like; an unsaturated amide compound such as (meth)acrylamide and the like; and the like. They may be used singularly or as a mixture of more than two.

Examples of the acryl-based binder resin may include a methacrylic acid/benzylmethacrylate copolymer, a methacrylic acid/benzyl methacrylate/styrene copolymer, a methacrylic acid/benzylmethacrylate/2-hydroxyethylmethacrylate copolymer, a methacrylic acid/benzyl methacrylate/styrene/2-hydroxyethylmethacrylate copolymer, and the like, but are not limited thereto. They may be used singularly or as a mixture of two or more.

The acryl-based binder resin may have a weight average molecular weight ranging from 3000 to 150,000 g/mol, specifically, from 5000 to 50,000 g/mol, and more specifically, from 20,000 to 30,000 g/mol. When the acryl-based binder resin has a weight average molecular weight within the range, the composition may have an excellent close contacting property with a substrate, good physical and chemical properties, and appropriate viscosity.

The acryl-based binder resin may have an acid value ranging from 15 to 60 mgKOH/g, and specifically, from 20 to 50 mgKOH/g. When the acryl-based binder resin has an acid value within the range, it can bring about excellent pixel resolution.

The acryl-based binder resin may be included in an amount ranging from 0.1 to 30 wt %, and specifically, from 5 to 20 wt % based on the total amount of the photosensitive resin composition. When the acryl-based binder resin is included within the range, the composition may have an excellent developing property and improved cross-linking, and thus has excellent surface flatness when fabricated into a color filter.

(C) Photopolymerization Initiator

The photopolymerization initiator is one generally used for preparing a photosensitive resin composition, and may include an acetophenone-based compound, a benzophenone-based compound, a thioxanthone-based compound, a benzoin-based compound, a triazine-based compound, an oxime-based compound, or a combination thereof.

The acetophenone-based compound may include 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like.

The benzophenone-based compound may include benzophenone, benzoyl benzoic acid, benzoyl benzoic acid methyl, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

The thioxanthone-based compound may include thioxanthone, 2-methylthioxanthone, isopropyl thioxanthone, 2,4-diethyl thioxanthone, 2,4-diisopropyl thioxanthone, 2-chlorothioxanthone, and the like.

The benzoin-based compound may include benzoin, benzoin methyl ether, benzoin ethyl ether, benzoin isopropyl ether, benzoin isobutyl ether, benzyldimethylketal, and the like.

The triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto1-yl)-4,6-bis(trichloromethyl)-s-triazine, 2-(4-methoxynaphtol-yl)-4,6-bis(trichloromethyl)-s-triazine, 2-4-trichloromethyl (piperonyl)-6-triazine, 2-4-trichloromethyl (4'-methoxystyryl)-6-triazine, and the like.

The oxime-based compound may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and the like.

The photopolymerization initiator may include a carbazole-based compound, a diketone-based compound, a sulfonium borate-based compound, a diazo-based compound, a nonimidazole-based compound, and the like, other than the aforementioned photopolymerization initiators.

The photopolymerization initiator may be included in an amount ranging from 0.1 to 5 wt %, and specifically, from 1 to 3 wt % based on the total amount of the photosensitive resin composition. When the photopolymerization initiator is included within the range, the composition may be sufficiently photopolymerized when exposed to light during the pattern-forming process for preparing a color filter, accomplishing excellent sensitivity and improving transmittance.

(D) Photopolymerizable Monomer

The photopolymerization monomer may include a multifunctional monomer having two or more hydroxyl groups. Examples of the photopolymerization monomer may include glycerol acrylate, dipentaerythritol hexaacrylate, ethylene glycol diacrylate, triethylene glycol diacrylate, 1,4-butanedioldiacrylate, 1,6-hexanediol diacrylate, neopentyl glycol diacrylate, pentaerythritol diacrylate, pentaerythritol triacrylate, pentaerythritol diacrylate, dipentaerythritol triacrylate, dipentaerythritol acrylate, pentaerythritol hexaacrylate, bisphenol A diacrylate, trimethylol propane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like.

The photopolymerization monomer may be included in an amount ranging from 0.1 to 30 wt %, and specifically, from 5 to 20 wt % based on the total amount of the photosensitive resin composition. When the photopolymerization monomer is included within the range, the composition may have excellent pattern characteristics and developing property.

(E) Solvent

The solvent is not specifically limited, but examples of the solvent include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylethyl acetate, propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetate alkyl esters such as methyl oxyacetate, ethyl oxyacetate, butyl oxyacetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like; monooxy monocarboxylic acid alkyl esters of a 2-alkoxy-2-methyl propionic acid alkyl such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate; or ketonic acid esters such as ethyl pyruvate. Furthermore, the solvent may be N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, carbonate ethylene, carbonate propylene, phenyl cellosolve acetate, and the like. These solvents may be used singularly or in a combination thereof.

The solvent, considering miscibility, reactivity, and the like, may include glycol ethers such as ethylene glycol monoethyl ether and the like; ethylene glycol alkylether acetates such as ethyl cellosolve acetate and the like; esters such as 2-hydroxy ethyl propionate and the like; diethylene glycols such as diethylene glycol monomethyl ether and the like; or propylene glycol alkylether acetates such as propylene glycol monomethylether acetate, propylene glycol propylether acetate, and the like.

In one embodiment, the solvent may include propylene glycol monomethylether acetate (PGMEA), ethyl lactate (EL), ethylene glycol ethyl acetate (EGA), cyclohexanone, or a combination thereof.

The solvent may be included in a balance amount, and specifically, in an amount ranging from 20 to 90 wt % based on the total amount of the photosensitive resin composition. When the solvent is included within the range, the photosensitive resin composition may have excellent coating properties and maintain excellent flatness in a layer having a thickness of 3 µm or more.

(F) Surfactant

The photosensitive resin composition may further include a surfactant to make uniformly disperse the pigment into the solvent and to improve leveling performance.

The surfactant may be a fluorine-based surfactant.

Examples of the fluorine-based surfactant may include F-482, F-484, F-478, and the like made by DIC Co., Ltd., but are not limited thereto.

The surfactant may include a silicon-based surfactant as well as the fluorine-based surfactant.

Examples of the silicon-based surfactant may include TSF400, TSF401, TSF410, TSF4440, and the like made by Toshiba Silicon Co., Ltd., but are not limited thereto.

The surfactant may be included in an amount ranging from 0.01 to 5 parts by weight, and specifically, from 0.1 to 2 parts by weight based on 100 parts by weight of the photosensitive resin composition. When the surfactant is included within the range, the composition may have fewer impurities generated after the development.

(G) Other Additive

The photosensitive resin composition may further include other additives such as malonic acid, 3-amino-1,2-propanediol, or a vinyl- or (meth)acryloxy-containing silane-based coupling agent, in order to prevent stains or spots during the coating, to adjust leveling, or to prevent pattern residue due to non-development. These additives may be adjusted in an amount depending on desired properties.

In addition, the photosensitive resin composition may additionally include an epoxy compound to improve the close contacting property and other characteristics if needed.

The epoxy compound may include an epoxy novolac acryl carboxylate resin, an ortho cresol novolac epoxy resin, a phenol novolac epoxy resin, a tetra methyl biphenyl epoxy resin, a bisphenol A-type epoxy resin, an alicyclic epoxy resin, or combinations thereof.

When the epoxy compound is included, a peroxide initiator or a radical polymerization initiator such as an azobis-based initiator can be additionally included.

The epoxy compound may be included in an amount of 0.01 to 5 parts by weight based on 100 parts by weight of the photosensitive resin composition. When the epoxy compound is included within the above range, storage, close contacting, and other properties may be improved.

The photosensitive resin composition has no particular limit in method, but can be prepared by mixing the aforementioned composite dye, acryl-based binder resin, photopolymerization initiator, photopolymerization monomer, and solvent, and selectively the pigment and additive.

According to another embodiment, provided is a color filter fabricated using the photosensitive resin composition.

This color filter may be fabricated in a general method, but in particular, using a method of spin-coating, roller-coating, slit-coating, and the like of the photosensitive resin composition to have a thickness ranging from 1.5 to 2.0 µm. After the coating, the layer is radiated with a UV ray, an electron beam, or an X-ray to form a pattern required for a color filter. The UV ray may have a wavelength region ranging from 190 to 450 nm, and specifically, from 200 to 400 nm. Next, when the coated layer is treated with an alkali developing solution, the unradiated region thereof may be dissolved, forming a pattern for an image color filter. This process is repeated depending on the necessary number of R, G, and B colors, fabricating a color filter having a desired pattern. In addition, the image pattern acquired by the development is cured through heat treatment, actinic ray radiation, or the like, resultantly improving crack resistance, solvent resistance, and the like.

MODE FOR INVENTION

Hereinafter, the present invention is illustrated in more detail with reference to examples. However, these are exemplary embodiments of present invention and are not limiting.

(Preparation of Photosensitive Resin Composition)

Photosensitive resin compositions were prepared using the following components.

(A) Composite dye (A-1) Red fluorescent dye (A-1-1) The compound represented by the following Chemical Formula 6 (SRI 1001, Cheil Industries Inc.) was used.

(A-1-2) The compound represented by the following Chemical Formula 7 (SRI 1003, Cheil Industries Inc.) was used.

[Chemical Formula 6]

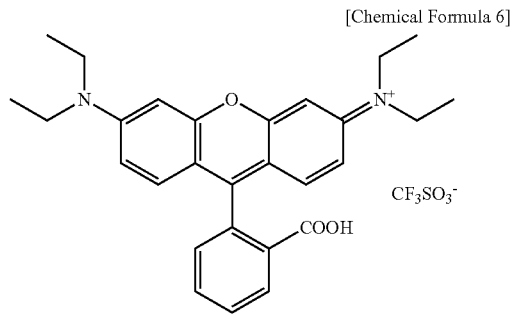

-continued

[Chemical Formula 7]

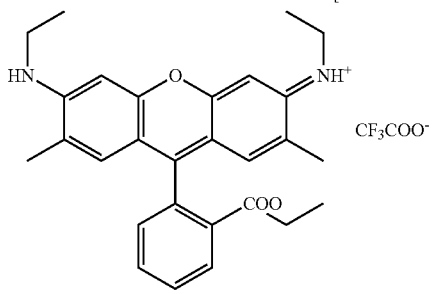

(A-2) Metal Complex Dye
YELLOW R (Kyung-In Synthetic Corporation) was used.
(A') Pigment
(A'-1) A mixture of C.I. pigment red 254 and C.I. pigment red 177 mixed in a weight ratio of 60:40 and solid content of 4.9% was used.
(A'-2) A C.I. pigment yellow 150 was used.
(B) Acryl-Based Binder Resin A methacrylic acid/benzyl-methacrylate copolymer having a weight average molecular weight of 28,000 g/mol, which was mixed in a weight ratio of 30:70 was used.
(C) Photopolymerization Initiator
CGI-124 made by Ciba Specialty Chemicals Co. was used.
(D) Photopolymerizable Monomer
Dipentaerythritolhexaacrylate was used.
(E) Solvent
(E-1) A mixture of propylene glycol monomethyl ether acetate and cyclohexanone was used.
(E-2) A mixture of propylene glycol monomethyl ether acetate and ethyl 3-ethoxypropionate was used.
(F) Surfactant
A fluorine-based surfactant (F-482, DIC Co., Ltd.) was used.

EXAMPLE 1

2 g of the photopolymerization initiator (C) was dissolved in 44.5 g of propylene glycol monomethyl ether acetate and 15 g of cyclohexanone as the solvent (E-1). The solution was agitated at room temperature for 2 hours. Subsequently, 2.9 g of the red fluorescent dye (A-1-1) 2.9 g and 0.1 g of the metal complex dye (A-2) were added and agitated for 30 minutes, and then 15.0 g of an acryl-based binder resin (B) and 20.0 g of a photopolymerizable monomer (D) were added and agitated at room temperature for 2 hours. Then, 0.5 g of a surfactant (F) was added and agitated at room temperature for 1 hour. The solution was filtrated three times to remove impurity so as to prepare a photosensitive resin composition.

EXAMPLE 2

A photosensitive resin composition was prepared according to the same method as in Example 1, except that 2.5 g of the red fluorescent dye (A-1-1) and 0.5 g of the metal complex dye (A-2) were added.

EXAMPLE 3

A photosensitive resin composition was prepared according to the same method as in Example 1, except that 2.0 g of the red fluorescent dye (A-1-1) and 1.0 g of the metal complex dye (A-2) were added.

EXAMPLE 4

A photosensitive resin composition was prepared according to the same method as in Example 1, except that 1.5 g of the red fluorescent dye (A-1-1) and 1.5 g of the metal complex dye (A-2) were added.

EXAMPLE 5

A photosensitive resin composition was prepared according to the same method as in Example 1, except that 1.3 g of the red fluorescent dye (A-1-1) and 1.7 g of the metal complex dye (A-2) were added.

EXAMPLE 6

A photosensitive resin composition was prepared according to the same method as in Example 1, except that 1.3 g of the red fluorescent dye (A-1-2) and 1.7 g of the metal complex dye (A-2) were added.

COMPARATIVE EXAMPLE 1

A photosensitive resin composition was prepared according to the same method as in Example 1, except that 3.0 g of the red fluorescent dye (A-1-1) was used without using the metal complex dye (A-2).

COMPARATIVE EXAMPLE 2

A photosensitive resin composition was prepared according to the same method as in Example 1, except that 3.0 g of the metal complex dye (A-2) was used without using the red fluorescent dye (A-1-1).

EXAMPLE 7

2 g of the photopolymerization initiator (C) was dissolved in 28.76 g of propylene glycol monomethyl ether acetate and 15 g of cyclohexanone as the solvent (E-1). The solution was agitated at room temperature for 2 hours. Subsequently, 1 g of red fluorescent dye (A-1-1) and 1 g of the metal complex dye (A-2) were added and agitated for 30 minutes, and then 15 g of the acryl-based binder resin (B) and 20 g of the photopolymerizable monomer (D) were added and agitated at room temperature for 2 hours. Herein, 15 g of the pigment (A'-1) and 1.74 g of the pigment (A'-2) were added, and agitated at room temperature for one hour, and then 0.5 g of the surfactant (F) was added and agitated at room temperature for one hour. The solution was filtered three times to remove impurity so as to prepare a photosensitive resin composition.

COMPARATIVE EXAMPLE 3

2 g of the photopolymerization initiator (C) was dissolved in 29.8 g of propylene glycol monomethyl ether acetate and 15.0 g of ethyl 3-ethoxypropionate as the solvent (E-2). The solution was agitated at room temperature for 2 hours. Subsequently, 5 g of the acryl-based binder resin (B) and 10 g of the photopolymerizable monomer (D) were added and agitated at room temperature for 2 hours. Herein, 33.8 g of the pigment A'-1 and 3.9 g of the pigment A'-2 were added and agitated at room temperature for one hour, and then 0.5 g of the surfactant (F) was added and agitated at room temperature for one hour. The solution was filtered three times to remove impurity so as to prepare a photosensitive resin composition.

Evaluation 1: Evaluation of Spectroscopic Characteristic of Dye

Figure 2:
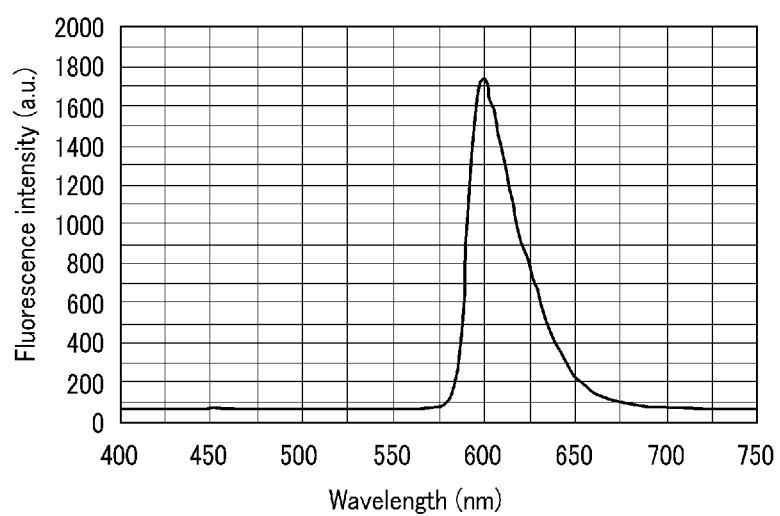
FIG. 2 is a graph showing the fluorescent spectrum of the red fluorescent dye used in Example 1.

FIG. 1 is a graph showing an absorbance spectrum of the red fluorescent dye used in Example 1, and FIG. 2 FIG. 2 is a graph showing the fluorescent spectrum of the red fluorescent dye used in Example 1.

Referring to FIGS. 1 and 2, since the red fluorescent dye had a maximum absorption wavelength of 555 nm and fluorescence, light was emitted at 600 nm which is longer than absorption wavelength.

(Pattern Formation for a Color Filter)

The photosensitive resin compositions according to Examples 1 to 7 and Comparative Examples 1 to 3 were respectively coated on a 10×10 cm² glass substrate in a spin-coating method and then pre-baked at 90° C. for 3 minutes. The resultants were cooled under air and then radiated by UV having a wavelength of 365 nm to an exposure amount of 100 mJ/cm², fabricating thin films. After the radiation, the thin films were post-baked at 230° C. in a hot air drier for 30 minutes, preparing a cured thin film.

Evaluation 2: Luminance and Contrast Ratio of Photosensitive Resin Composition

The cured thin films according to Examples 1 to 7 and Comparative Examples 1 to 3 were measured regarding color coordinate, luminance, and contrast ratio according to the following method. The results are shown in the following Table 1.

(1) Color coordinates (x and y) and luminance (Y): A colorimeter (MCPD 3000, Korea Otsuka Pharmaceutical Co., Ltd.) was used.

(2) Contrast ratio: A contrast ratio measurement device (Tsubosaka Electronic Co. Ltd., CT-1, 30,000:1) was used.

TABLE 1

|  | Color coordinate | | Luminance | Contrast |
| --- | --- | --- | --- | --- |
|  | x | y | Y | ratio |
| Example 1 | 0.420 | 0.148 | 16.9 | 1,700 |
| Example 2 | 0.450 | 0.180 | 17.8 | 2,500 |
| Example 3 | 0.550 | 0.215 | 18.5 | 5,300 |
| Example 4 | 0.600 | 0.292 | 19.3 | 8,500 |
| Example 5 | 0.655 | 0.325 | 19.6 | 12,100 |
| Example 6 | 0.655 | 0.325 | 19.5 | 12,000 |
| Comparative Example 1 | 0.321 | 0.128 | 16.5 | 1,200 |
| Comparative Example 2 | 0.482 | 0.494 | 85.6 | 15,000 |
| Example 7 | 0.655 | 0.325 | 18.9 | 13,000 |
| Comparative Example 3 | 0.655 | 0.325 | 18.5 | 12,000 |

It may be seen from Table 1 that Examples 1 to 5 which used a composite of the red fluorescent dye and metal complex dye in accordance with one embodiment had both high luminance and high contrast ratio. Also, it may be seen from Examples 1 to 4 that as the amount of the red fluorescent dye was decreased, luminance and contrast ratio were increased while the color coordinate x and y were increased. In addition, Example 6 using a red fluorescent dye having the different kind of counter ion from Examples 1 to 4 also improved luminance and contrast ratio.

On the other hand, Comparative Examples 1 and 2 including either the red fluorescent dye and the metal complex dye had significantly different color coordinate from the conventional color target; and in the case of using only red fluorescent dye, the contrast ratio was very low, and in the case of using only metal complex dye, the color was near to almost yellow. Accordingly, the optical scattering was effectively prevented by mixing the red fluorescent dye with the metal complex dye, so luminance and contrast ratio may be improved.

In addition, Comparative Example 3 including only pigment decreased both luminance and contrast ratio compared to Example 7 including a mixture of red fluorescent dye and metal complex dye and pigment. Thereby, it is understood that luminance and contrast ratio may be improved even by applying a composite dye for a pigment material.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. The aforementioned embodiments are exemplary but are not limiting in any way.

The invention claimed is:

1. A photosensitive resin composition, comprising:
   1 to 80 wt % of a composite dye,
   0.1 to 30 wt % of an acryl-based binder resin,
   0.1 to 5 wt % of a photopolymerization initiator,
   0.1 to 30 wt % of a photopolymerizable monomer, and
   a balance amount of a solvent,
   wherein the composite dye comprises:
   a red fluorescent dye that absorbs light of a visible region of spectrum and re-emits light in a wavelength greater than the wavelength of absorbed light; and
   a metal complex dye including at least one metal ion selected from Mg, Ni, Co, Zn, Cr, Pt, and Pd.

2. The photosensitive resin composition of claim 1, wherein the red fluorescent dye comprises a compound represented by the following Chemical Formula 1:

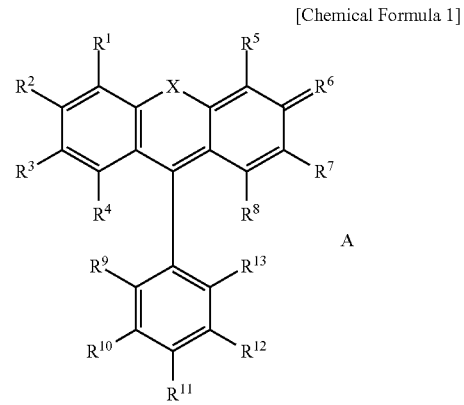

[Chemical Formula 1]

wherein, in Chemical Formula 1, $R^2$ is —OH, —O—, or —$NR^aR^b$, wherein $R^a$ and $R^b$ are each independently hydrogen, a substituted or unsubstituted C1 to C5 alkyl group, a substituted or unsubstituted C1 to C5 alkoxy group, a substituted or unsubstituted C3 to C10 cycloalkyl group, a substituted or unsubstituted C3 to C10 heterocycloalkyl group, a substituted or unsubstituted C6 to C20 aryl group, a substituted or unsubstituted C3 to C20 heteroaryl group, or a substituted or unsubstituted C1 to C5 alkyl (meth)acrylate group, or $R^a$ and $R^b$ are respectively linked to $R^1$ and $R^3$ to form a ring, $R^6$ is =O or =$NR^cR^{d+}$, wherein $R^c$ and $R^d$ are each independently hydrogen, a substituted or unsubstituted C1 to C5 alkyl group, a substituted or unsubstituted C1 to C5 alkoxy group, a substituted or unsubstituted C3 to C10 cycloalkyl group, a substituted or unsubstituted C3 to C10 heterocycloalkyl group, a substituted or unsubstituted C6 to C20 aryl group, a substituted or unsubstituted C3 to C20 heteroaryl group, or a substituted or unsubstituted C1 to C5 alkyl (meth)acrylate group, or $R^c$ and $R^d$ are respectively linked to $R^5$ and $R^7$ to form a ring, $R^1$, $R^3$ to $R^5$ and $R^7$ to $R^{13}$ are each independently hydrogen, a halogen, a carboxyl group, —COO⁻, —COOR$^e$, wherein R$^e$ is a substituted or unsubstituted C1 to C10 alkyl group, a sulfonic acid group, —SO$_3^-$, —SO$_2$Cl⁻, a nitro group, a hydroxy group, —HgOH, a substituted or unsubstituted C1 to C20 alkyl group, a radical represented by the following Chemical Formula 2, or NRR', wherein R and R' are each independently hydrogen, a substituted or unsubstituted C1 to C20 alkyl group, a substituted or unsubstituted C6 to C30 aryl group, or a radical represented by the following Chemical Formula 3, with the proviso that at least one of $R^1$ and $R^3$-$R^{13}$ has an ionic charge, X is —O—, —S—, —CO—, or —NR$^f$—, wherein R$^f$ is hydrogen, or a substituted or unsubstituted C1 to C20 alkyl group, and A is a halide ion, ClO$_4^-$, BF$_4^-$, SbF$_6^-$, CF$_3$SO$_3^-$, CF$_3$COO⁻, N(SO$_2$CF$_3$)$_2^-$, one of ionic compounds represented by the following Chemical Formulae 4-1 and 4-2, an alkali metal cation, an alkaline-earth metal cation, or an alkyl ammonium, wherein A is a counter ion based on the ionic charge of at least one of $R^1$ and $R^3$-$R^{13}$,

[Chemical Formula 2]

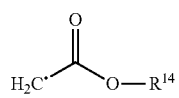

wherein, in Chemical Formula 2,
$R^{14}$ is hydrogen, or a substituted or unsubstituted C1 to C20 alkyl group,

[Chemical Formula 3]

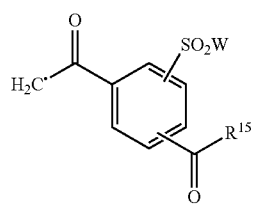

wherein, in Chemical Formula 3,
$R^{15}$ is hydrogen, or a substituted or unsubstituted C1 to C20 alkyl group, and W is a halogen,

[Chemical Formula 4-1]

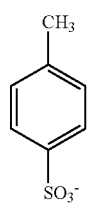

[Chemical Formula 4-2]

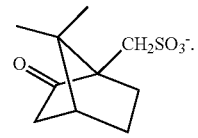

3. The photosensitive resin composition of claim 2, wherein the red fluorescent dye comprises at least one selected from the compounds represented by the following Chemical Formulae 5-1 to 5-12:

[Chemical Formula 5-1]

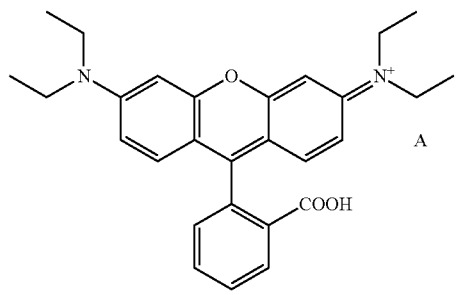

wherein, in Chemical Formula 5-1, A is a halide ion, ClO$_4^-$, BF$_4^-$, SbF$_6^-$, CF$_3$SO$_3^-$, CF$_3$COO⁻, N(SO$_2$CF$_3$)$_2^-$, or one of ionic compounds represented by the above Chemical Formulae 4-1 and 4-2,

[Chemical Formula 5-2]

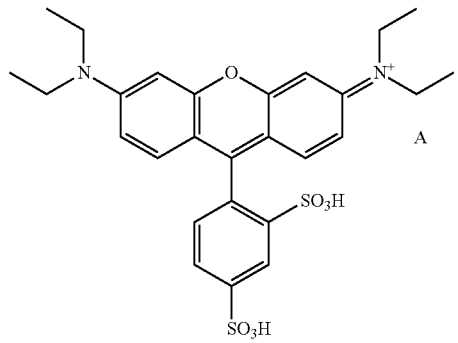

wherein, in Chemical Formula 5-2, A is a halide ion, ClO$_4^-$, BF$_4^-$, SbF$_6^-$, CF$_3$SO$_3^-$, CF$_3$COO⁻, N(SO$_2$CF$_3$)$_2^-$, or one of ionic compounds represented by the above Chemical Formulae 4-1 and 4-2,

[Chemical Formula 5-3]

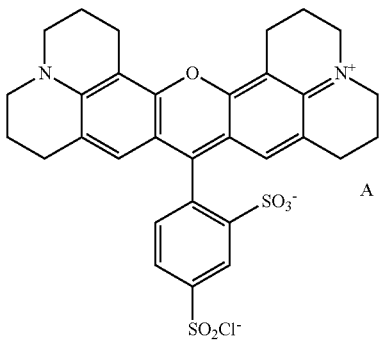

wherein, in Chemical Formula 5-3, A is an alkali metal cation or an alkyl ammonium,

[Chemical Formula 5-4]

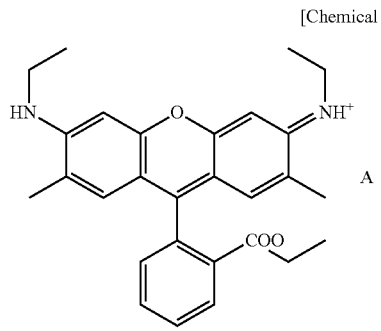

wherein, in Chemical Formula 5-4, A is a halide ion, $ClO_4^-$, $BF_4^-$, $SbF_6^-$, $CF_3SO_3^-$, $CF_3COO^-$, $N(SO_2CF_3)_2^-$, or one of ionic compounds represented by the above Chemical Formulae 4-1 and 4-2,

[Chemical Formula 5-5]

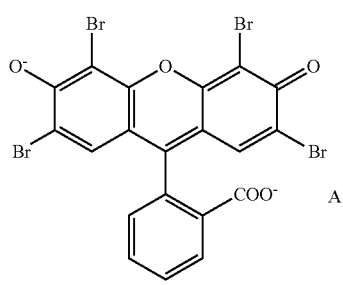

wherein, in Chemical Formula 5-5, A is an alkali metal cation or an alkyl ammonium,

[Chemical Formula 5-6]

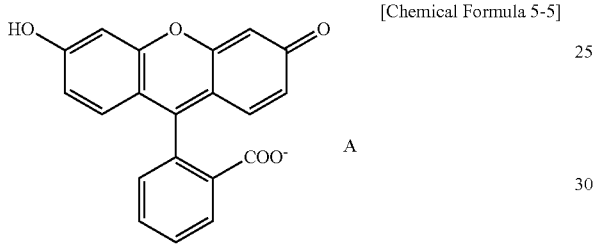

wherein, in Chemical Formula 5-6, A is an alkaline-earth metal cation,

[Chemical Formula 5-7]

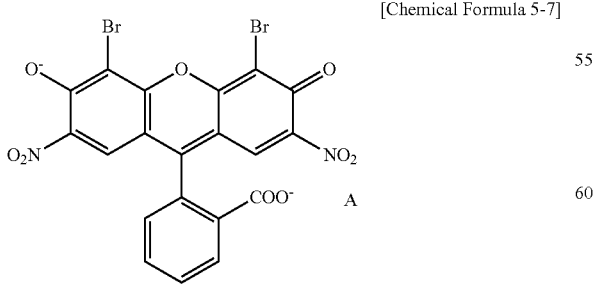

wherein, in Chemical Formula 5-7, A is an alkaline-earth metal cation,

[Chemical Formula 5-8]

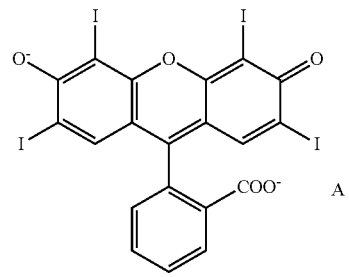

wherein, in Chemical Formula 5-8, A is an alkaline-earth metal cation,

[Chemical Formula 5-9]

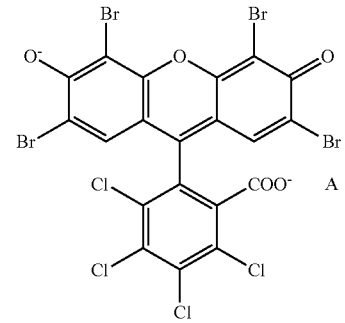

wherein, in Chemical Formula 5-9, A is an alkaline-earth metal cation,

[Chemical Formula 5-10]

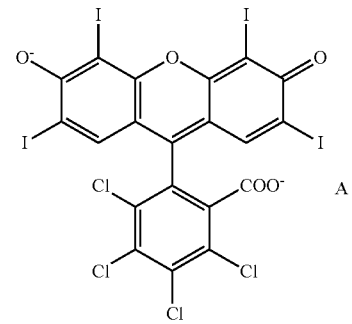

wherein, in Chemical Formula 5-10, A is an alkaline-earth metal cation,

[Chemical Formula 5-11]

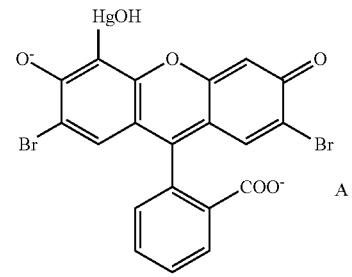

wherein, in Chemical Formula 5-11, A is an alkaline-earth metal cation,

[Chemical Formula 5-12]

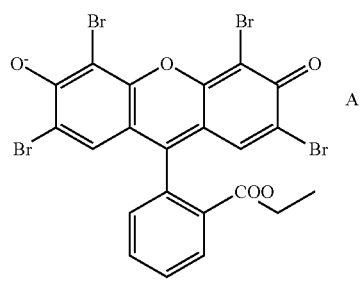

[Chemical Formula 7]

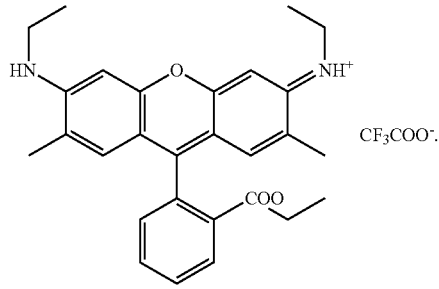

wherein, in Chemical Formula 5-12, A is an alkali metal cation or an alkyl ammonium.

4. The photosensitive resin composition of claim 1, wherein the red fluorescent dye includes at least one selected from the compounds represented by the following Chemical Formula 6 and the following Chemical Formula 7:

[Chemical Formula 6]

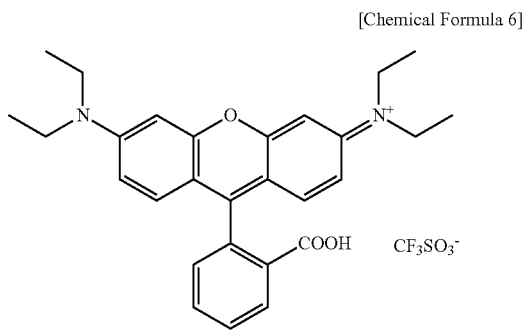

5. The photosensitive resin composition of claim 1, wherein the red fluorescent dye has a maximum absorption peak in the wavelength of 450 to 650 nm.

6. The photosensitive resin composition of claim 1, wherein the metal complex dye has a maximum absorption peak in the wavelength of 200 to 800 nm.

7. The photosensitive resin composition of claim 1, wherein the metal complex dye comprises a composite of a metal ion; and at least one selected from solvent yellow 19, solvent yellow 21, solvent yellow 82, solvent orange 45, solvent orange 62, solvent red 8, solvent red 32, and solvent red 109.

8. The photosensitive resin composition of claim 1, wherein the composite dye comprises the red fluorescent dye and the metal complex dye at a weight ratio of 1:0.5 to 1:2.

9. The photosensitive resin composition of claim 1, wherein the composite dye has a maximum absorption peak in the wavelength of 450 to 650 nm.

10. The photosensitive resin composition of claim 1, wherein the photosensitive resin composition further comprises a pigment.

11. The photosensitive resin composition of claim 10, wherein the photosensitive resin composition includes the composite dye and the pigment at a weight ratio of 1:9 to 9:1.

12. A color filter manufactured using the photosensitive resin composition according to claim 1.

* * * * *